(12) United States Patent
Angelescu et al.

(10) Patent No.: US 8,389,054 B2
(45) Date of Patent: Mar. 5, 2013

(54) FABRICATION TECHNIQUE FOR METALLIC DEVICES WITH EMBEDDED OPTICAL ELEMENTS, OPTICAL DEVICES, OR OPTICAL AND ELECTRICAL FEEDTHROUGHS

(75) Inventors: Dan Eugen Angelescu, Noisy le Grand Cedex (FR); Robert J. Schroeder, Newtown, CT (US)

(73) Assignee: Schlumberger Technology Corporation, Sugar Land, TX (US)

( * ) Notice: Subject to any disclaimer, the term of this patent is extended or adjusted under 35 U.S.C. 154(b) by 1023 days.

(21) Appl. No.: 12/191,908

(22) Filed: Aug. 14, 2008

(65) Prior Publication Data

US 2010/0041155 A1 Feb. 18, 2010

(51) Int. Cl.
 *C23C 16/00* (2006.01)
(52) U.S. Cl. .................................................. 427/250
(58) Field of Classification Search .............. 427/96.8, 427/166
See application file for complete search history.

(56) References Cited

U.S. PATENT DOCUMENTS

| 6,787,339 | B1 | 9/2004 | Rhine | |
|---|---|---|---|---|
| 7,261,824 | B2 | 8/2007 | Schlautmann et al. | |
| 7,361,313 | B2 | 4/2008 | Chan | |
| 8,080,280 | B1 * | 12/2011 | Grubbs et al. | 427/248.1 |
| 2003/0031790 | A1 * | 2/2003 | Zhuang et al. | 427/250 |
| 2007/0178694 | A1 * | 8/2007 | Hiatt | 438/667 |
| 2009/0280643 | A1 * | 11/2009 | Andry et al. | 438/656 |

OTHER PUBLICATIONS

Van Hemert et al., "Vapor deposition of metals by hydrogen reduction of metal chelates", Journal of the Electrochemical Society, pp. 1123-1126 (1965).*
Dan Angelescu, Highly Integrated Microfluidic Design, "Fabrication Technologies", Chapter 1, 2011 Artech House, Norwood, MA, 49 pages.
Bacher et al, "Fabrication of LIGA mold inserts", Microsystems Technologies 4 (1998) pp. 117-119.
Christenson et al, "A batch wafer scale LIGA assembly and packaging technique via diffusion bonding", in Proc IEEE Int Conference MEMS, pp. 476-481 (1999).
Ehrfeld et al, "Microreactors New Technology for Modern Chemistry" Wiley-VCH Verlag, Weinheim, Germany pp. 15-40 (2000).
Groner et al, "Electrical characterization of thin Al2O3 films grown by atomic layer deposition on silicon and various metal substrates", Thin Solid Films 413, (2002) pp. 186-197.
Hanneborg et al, "Silicon-to-silicon anodic bonding with a borosilicate glass layer", J Micromech Microeng 1, (1991), pp. 139-144.
Knights, "Micro Molds Make Micro Parts", Plastics Technology online at http://www.plasticstechnology.com/carticles/200212fa1.html 7 pages, Dec. 2002.

(Continued)

*Primary Examiner* — Matthew Daniels
*Assistant Examiner* — Erin Snelting
(74) *Attorney, Agent, or Firm* — Jakub M. Michna; Rachel E. Greene; Brigid M. Laffey

(57) ABSTRACT

Methods and related systems for fabricating a device or a part, the method including the step of growing at least one material from a vapor phase, by a CVD process, for example a MO-CVD process, on a heated base substrate, wherein the at least one material conforms to one of at least one topographical pattern of the base substrate, one or more predefined geometrical shape on the base substrate or both. The method includes removing the base substrate embedded in the CVD deposited material, as well as optionally machining a portion of the CVD deposited material.

28 Claims, 8 Drawing Sheets

OTHER PUBLICATIONS

McDonald et al, "Fabrication of microfluidic systems in poly(dimethylsiloxane)", Electrophoresis 2000, 21, pp. 27-40.

Muhlberger et al, "Microfluidic polyether ether keton (peek) chips combined with contactless conductivity detection for mTAS", 9th International Conference on Miniaturized Systems for Chemistry and Life Sciences, Oct. 9-13, 2005, Boston, MA, pp. 184-186.

Papautsky et al, "Effects of rectangular microchannel aspect ratio on laminar friction constant", in Proc. SPIE Micro Fluidic Devices and Systems, Santa Clara, CA Sep. 20-22, 1999, pp. 147-158.

Patel et al, "Cofired ceramic microdevices for high temperature and high pressure applications", 9th International Conference on Miniaturized Systems for Chemistry and Life Sciences, Oct. 9-13, 2005, Boston, MA, pp. 709-711.

Terekhov et al, "Recycling metals using the MOCVD process", Proceedings of the TMS Fall Extraction and Processing Conference, pp. 487-491 (2000).

Williams et al, "Etch rates for micromachining processing Part II", Journal of Micrelectromechanical Systems, vol. 12, No. 6, Dec. 2003.

* cited by examiner

FABRICATION TECHNIQUE FOR METALLIC DEVICES WITH EMBEDDED OPTICAL ELEMENTS, OPTICAL DEVICES, OR OPTICAL AND ELECTRICAL FEEDTHROUGHS

BACKGROUND OF THE INVENTION

1. Field of the Invention

The present invention generally relates to methods and systems of fabricating devices. More particularly, this invention relates to methods for fabricating devices having embedded features such as optical and electrical feedthroughs as well as microfabricated features such as microchannels. Several embodiments of this invention relate to methods for fabricating microfluidic devices, having embedded features such as optical and electrical feedthroughs.

2. Background of the Invention

Often in many applications there is a need for transmitting optical or electrical signals from one side of a metallic part to the other. Often, such transmission needs to occur while there is a significant pressure difference between the two sides of the metallic part. Several solutions exist to this problem, including but not limited to the use of optical windows sealed with elastomeric o-rings or brazed to the metallic part and, respectively, use of electrical bulkheads, or feedthroughs, fabricated out of electrically insulating material (usually plastic) and incorporating one or several electrical pins which traverse the feedthrough.

In many applications there is also a need for a metallic part with very intricate details machined in it, such as small channels and holes, at length scales and resolutions down to the micron level, which are not easily achievable using conventional machining techniques. One example of a situation where such a need exists is in the manufacturing of metallic microfluidic devices.

There has been tremendous growth recently in the use of micromachining for fabricating microstructures, microsensors, and microfluidic devices, and in integrating these microstructures with electronic circuits. Micromachining is the process of forming structures having micron-sized detail by producing patterns on the surface or bulk of a substrate, or in layers of material deposited on a substrate. The material layers can be formed using a variety of processes, including sputtering, evaporation, physical vapor deposition, chemical vapor deposition and spin coating. Patterns are produced in these material layers by processes such as photolithography, precision physical machining, chemical etching, laser ablation, focused ion beam etching, ultrasonic drilling and electrodischarge machining, to yield the micromachined device.

Microfluidic devices, sensors, and systems, are also becoming increasingly common in several industries, such as pharmaceuticals, biotech, chemical engineering, homeland security, environmental engineering etc. For example, microfluidic devices can be used to transmit force and energy in hydraulic systems, such in the design of smart tools where the motion of the human hand must be scaled down to submillimeter dimensions, with a corresponding reduction in force. Further, microscale devices may also permit the assembly of a multiplicity of different functional devices in one compact, interconnected system. For example, individual microfluidic accessories such as mixers, micro-contactors, reactors, pumps, and valves may be added on a substrate containing microfluidic channels that connect such components in a microfluidic device Microstructure technology offers distinct advantages over "macroscale" technology, including, for example, the ability to perform efficient and rapid chemical analyses at a lower cost per analysis, because of decreased sample volume requirements and increased throughput. Small sample volumes are advantageous because they allow a user to perform multiple analyses in parallel using a single sample on a single chip.

A variety of microfluidic applications require electrical conductors. Conductors can be used to form electrical interconnections ("interconnects") between elements of a microfluidic device, such as electrodes, and elements external to the device, such as power sources and data acquisition systems. Such interconnects can provide electrical flow to the electrode to power electrostatic, electromagnetic or electrohydrodynamic micropumps, to operate microvalves, or to induce electrolysis of a sample fluid. Conductors may also be used to guide electrical signals from sensor located on the microfluidic chip to data acquisition and analysis systems that are external. Conductors can also be used as resistive heaters for sample fluids or as temperature sensors in microfluidic applications.

Developments in the semiconductor processing industry have facilitated the fabrication of micron-sized structures, including sensors and monitoring systems that can be used in microfluidic devices. The fabrication of microfluidic devices requires a method of producing fluidic connections, referred to as microchannels, and electrical interconnects between regions of a single device or between a device and accessories such as power supplies, data acquisition systems, automatic valves, pumps, or syringes. Microfluidic devices typically consist of several components, such as: microchannels for fluid flow (typical dimensions may include 100 micron square cross section and a few centimeters in length); fluidic inlet and outlet ports, with appropriate fittings (typically able to accommodate capillary tubing); fluidic manipulation components (microvalves, micropumps, droplet or particle manipulators etc.); and embedded sensors and measurement devices (such as pressure, optical, chemical and electrical sensors etc.).

The fabrication of microfluidic devices can involve fabricating by one of several available technologies (below), open-top microchannels on a plane substrate, and then bonding the resulting part to a plane or structured layer, henceforth called the top layer, that provides a fourth wall to the channels, completely enclosing them. Inlet and outlet ports typically consist of through-holes that connect an end of one channel to some kind of tubing fitting. The substrate or the top layer may include various additional components of the system, such as sensors, optical fibers, optical windows, electrodes, valves and pumps, etc.

An existing fabrication technology for creating microchannels can include cure-molding of elastomers, e.g., soft lithography (J. C. McDonald et al., "Fabrication of microfluidic systems in poly(dimethylsiloxane)", Electrophoresis, 21, p. 27 (2000), to replicate photoresist master molds. The resulting surface with molded open-faced channels can typically be bonded to a glass layer or to another elastomer layer after an oxygen plasma treatment. Typically, this method results in soft devices that are unable to withstand high pressures, and are quite susceptible to swelling in the presence of organic solvents. The attractiveness of this technique consists of the fast prototyping capabilities, and optical clarity of the silicone elastomers typically used.

Another known fabrication technology for creating microchannels may include injection molding or embossing of plastics (typically low temperature materials such as polystyrene, polycarbonate, polymethylmethacrylate, polypropylene, cyclic olefin copolymer, but also including high-performance materials such as PEEK). Thermal lamination, adhesive bonding or plasma treatments in this case can be used for subsequent bonding. Very few plastics provide a strength/chemical compatibility/temperature resistance combination that is attractive for use in harsh environments, one of these being PEEK. N2 plasma proves to be particularly useful in creating a strong PEEK to PEEK bond, as recently reported, often stronger than the intrinsic material strength (H. Mühlberger, A. E. Guber, W. Hoffmann—"Microfluidic Polyether Ether Keton (Peek) Chips Combined With Contactless Conductivity Detection For mTAS" Proceedings of the MicroTAS Conference 2005, p. 184 (2005)). One issue among many other potential issues limiting the use is the fabrication of the mold insert tool, which needs to be made of a very strong material (such as Nickel in pure form or in one of several alloys) but at the same time have very fine microstructures machined into it. Still, another issue is the optical opacity of some plastic materials (including PEEK), requiring complicated post-fabrication processing to incorporate optical pathways (e.g. by embedding or adhesively bonding optical fibers).

Other known fabrication technologies for creating microchannels include co-firing of ceramic materials. This method has potential of providing microfluidic devices which provide for some temperature and pressure qualification of the materials and bonds (K. D. Patel, K. W. Hukari, K. A. Peterson—"Cofired Ceramic Microdevices For High Temperature And High Pressure Applications" Proceedings of the MicroTAS Conference 2005, p. 709 (2005)).

Another known fabrication technology for creating microchannels may include silicon micromachining. Silicon micromachining can be used to etch different channel geometries in single-crystal silicon wafers, the resulting channels being subsequently sealed with one or several layers of borosilicate glass (e.g. Pyrex) by anodic bonding. This method has many drawbacks such as the brittleness and chemical resistance of the materials, which ultimately limit its use in the field. The bond strength of the interface may also be an issue if high internal pressures are required (A. Hanneborg, M. Nese, P. Ohlckers—"Silicon-to-Silicon Anodic Bonding With a Borosilicate Glass Layer" J. Micromech. Microeng. 1, p. 139 (1991)). Bonding between two silicon wafers can also be achieved using an intermediate glass layer, direct (or fusion) bonding and eutactic bonding. Other known fabrication technologies for creating microchannels include can glass etching (usually of chemical nature, or by powder blasting or ultrasonic machining) can be used to create channels in glass, which can then be bonded to another layer of glass by direct bonding. A downside of this method is the difficulty to create very high aspect ratio, vertical wall structures.

Another known fabrication technology for bonding of metallic external components (such as inlet and outlet tubes) to the materials such as Nickel parts, can be achieved by diffusion bonding (or solid-state welding), welding or brazing. Several companies exist which specialize in this kind of operations, and reports also exist in the scientific literature (T. R. Christenson, D. T. Schmale—"A Batch Wafer Scale LIGA Assembly and Packaging Technique via Diffusion Bonding," in Proc. IEEE Int. Conf. MEMS, p. 476 (1999)).

Another known fabrication technology for creating microchannels may include electrolytic metal deposition. Electrolytic metal deposition can be used to grow layers of metal however a substantial drawback in using such a method is that the metal grows only on conductive surfaces, so metallization is required in order to create a perfect metal topographical copy of a surface. Metallic parts fabricated using the LIGA technology may be used as metallic parts by themselves or as tools for plastic injection molding inserts (LIGA—W. Bacher, K. Bade, B. Matthis, M. Saumer, R. Schwarz—"Fabrication of LIGA mold inserts" Microsystem Technologies 4, p. 117 (1998)). This method has been used to create enclosed channels and chambers, typically by using sacrificial layers, or by bonding together several thin layers of electroplated metal using diffusion bonding techniques (T. R. Christenson, D. T. Schmale "A Batch Wafer Scale LIGA Assembly and Packaging Technique via Diffusion Bonding," in Proc. IEEE Int. Conf. MEMS, p. 476 (1999)). A drawback of the technique is the expensive and time-consuming electrolytic metal deposition step, often requiring several weeks of deposition to create a metallic part a few mm thick.

Other known fabrication technologies for creating microchannels may include other precision engineering machining methods, such as micro electro discharge machining, laser ablation, punching/drilling/embossing, wet etching of intermediate metal foils etc. (W. Ehrfeld, V. Hessel, H. Lowe—"Microreactors—New Technology for Modern Chamistry" Wiley-VCH Verlag, Weinheim, Germany, pp. 15-40 (2000)). These typically impose resolution limitations when compared to photolithography-type methods, and tool size may affect the minimum feature size and/or density of microstructures. Precision machining provides, however, a viable way to creating molding inserts for microchannel structures, particularly when they are not too densely packed (Mikell Knights, "Micro Molds Make Micro Parts", PlasticsTechnology online: see plasticstechnology.com/articles/200212fa1.html).

Chemical Vapor Deposition (CVD) is a thin film deposition method relying on chemical reactions between gaseous precursors occurring on or near the substrate surface. CVD is usually performed in a CVD furnace at very high temperatures, which many materials cannot tolerate. CVD should be therefore be performed as one of the first steps in the silicon fabrication process. A variant of the CVD commonly used in the microelectronics industry is plasma-enhanced CVD (PE-CVD) whereby a plasma of the reacting gases is created to enhance reactivity and allows faster deposition rates at lower temperatures. Several materials can be deposited by CVD or PE-CVD, most commonly: polysilicon, silicon nitride, silicon oxide, and some metals. The resulting films are usually conformal; their properties depending a lot on process parameters: temperature, pressure, gas flow rates. A CVD variant called metalorganic CVD or MO-CVD can be used for deposition of thin as well as very thick conformal metal layers, such as CVD metal fabrication (see Terekhov, D. S., O'Meara, M.: "Recycling metals using the MO-CVD process", Proceedings of the TMS Fall Extraction and Processing Conference, p. 487 (2000).

Accordingly, there is a need for improved methods and systems capable of providing devices worthy of use in demanding environments so as to withstand, by non-limiting example, high pressures, high temperatures and harsh environments. There is also the need for versatile fabrication methods capable of batch manufacturing and/or batch processing of parts having characteristics, such as: high structural strength and excellent chemical resistance.

SUMMARY OF INVENTION

It is therefore an aspect of at least one embodiment of the invention to overcome one or more of the above and other drawbacks of the prior art and to provide for methods and systems of fabricating a device and/or part, that incorporates growing a material resulting in embedding features such as optical and electrical feedthroughs into the device and/or part.

It is noted that a device is defined for purposes according to embodiments of the invention as a piece of equipment or a mechanism designed to serve a special purpose or perform a special function. Further, it is noted that a part is defined for purposes according to embodiments of the invention as a constituent member of a machine or other apparatus.

According to an embodiment of the invention, a method of fabricating a device, the method includes the step of growing at least one material from a vapor phase, for example by a CVD process, on a heated base substrate, wherein the at least one material conforms to one of at least one topographical pattern of the base substrate, one or more predefined geometry shapes, made of the same or of a different material than the base substrate, and physically placed on the base substrate, or both. The method includes removing the base substrate embedded in the CVD deposited material, and/or optionally machining at least a portion of the CVD deposited material, a portion of a predefined geometrical shapes embedded in the CVD deposited material, or both.

According to an embodiment of the invention, a method of fabricating one of a device or a part. The method comprising: growing at least one material from a vapor phase, by a Chemical Vapor Deposition (CVD) process, on a base substrate, wherein the at least one material conforms to one of at least one topographical pattern of the base substrate, one or more predefined geometrical shape on the base substrate or both; and removing the base substrate embedded in the CVD-deposited material.

According to an aspect of the invention, the at least one topographical pattern of the base substrate can be patterned with photoresist, wherein the photoresist is stripped by one of pyrolysis, plasma or chemical etching after the MO-CVD deposition process. The can include the CVD process as a CVD variant process such as an metalorganic CVD or MO-CVD process. Further, the at least one material can be a conductive material, non-conductive material or some combination thereof. Optionally, the method can include the step of machining a portion of either the MO-CVD deposited material, the predefined geometrical shape material, or both. Also, the at least one topographical pattern of the base substrate can be from the group consisting of an optical element, an optical device, a portion of a channel, an enclosed channel, an optical feedthrough, an electrical feedthrough, a sensor device, a wire shaped device or some combination thereof. The optical element may include one of one or more optical window, optical lens or one or more optical filter. The optical device can include one of one or more optical fiber, optical fiber feedthrough or an optical fiber sensor having optical fibers with an intrinsic optical sensor. It is also possible the one or more predefined geometry shape positioned on the base substrate is from the group consisting of an optical element, an optical device, a portion of a channel, an enclosed channel, an optical feedthrough, a ceramic device, an isolated electrical device, a sensor device, a wire shaped device or some combination thereof. Further, the optical element can include one of one or more optical window, optical lens or one or more optical filter. Also, the optical device may include one of one or more optical fiber, optical fiber feedthrough or an optical fiber sensor having optical fibers with an intrinsic optical sensor. It is possible the method can provide for batch manufacturing a plurality of devices one or more of one of an optical element, an optical device, a portion of a channel, an enclosed channel, an optical feedthrough, an electrical feedthrough, a sensor device, a wire shaped device or some combination thereof.

According to another aspect of the invention, step a) the CVD process may include using a Nickel material that provides for conformity onto one or more surface heated to an approximate temperature between 175 to 250 C in a deposition chamber. Also, the Nickel material deposited onto the one or more surfaces can conformally grow around one or more exposed component so as to create a pressure seal. The pressure seal can be maintained up to a temperature approximately below a Nickel deposition temperature. Further, step a) the CVD process can include using at least one material from the group consisting one of a group from transition elements, a group from platinum elements and a Beryllium material. The group from transition elements may include at least one material from the group consisting one of Cobalt, Iron, Manganese, Tungsten, Molybdenum, Chromium or some combination thereof. The group from platinum elements may include at least one material from the group consisting one of Platinum, Palladium, Osmium, Iridium, Ruthenium, Rhenium, Rhodium or some combination thereof.

According to another aspect of the invention, it is also possible step a) may further comprise of at least one additional geometrical shape in contact with the substrate having an open-pore structure. Wherein the at least one additional geometrical shape in contact with the substrate having the open-pore structure is embedded in the CVD-deposited material wherein the at least one material conforms to one of at least one topographical pattern of the base substrate, one or more predefined geometrical shapes on the base substrate or both. Also, the at least one additional geometric shape can be uniform, non-uniform or any combination thereof. Further, the at least one additional geometric shape can be two or more additional geometric shapes that are structured and arranged uniformly, non-uniformly, equally spaced from one another, non-equally spaced from one another, or any combination thereof. It is possible, the open-pore structure material can be from the group consisting of one of a conductive material, non-conductive material, a glass, a different material from the at least one material, a metal, a ceramic material, a polymeric material, a insulating material, a non-insulating material or any combination thereof.

According to another aspect of the invention, the fabricated device can be a microfluidic device, such that the microfluidic device and/or the fabricated part are operable in one of a subterranean environment, a well bore, or an oil field application. Further, step b) may include removing the based substrate so as to form a CVD base part, securing the CVD base part to one of a second similar CVD base part, at least one other mechanical part or both. Wherein the method of securing is from the group consisting of bonding, brazing, solid-state (diffusion) bonding, E-beam or laser welding, conventional welding. Further, the securing of the CVD base part may be to one of a second similar CVD base part, at least one other mechanical part or both, forms one or more features. Wherein the one or more features is from the group consisting of a plurality of final encapsulated channels, at least one channel, at least one optical element, one or more optical devices, at least one optical and electrical feedthrough, one or more wire shaped device or some combination thereof.

According to another embodiment of the invention, a system of fabricating a part capable of operating in an oilfield application, or the like. The system comprising: growing at least one material from a vapor phase, by a MO-CVD process, on a heated base substrate, wherein the at least one material conforms to one of at least one topographical pattern of the base substrate, one or more predefined geometrical shape on the base substrate or both; and removing the base substrate embedded in the MO-CVD deposited material.

According to another aspect of the invention, step b) may include removing the based substrate so as to form a MO- CVD base part, securing the MO-CVD base part to one of a second similar MO-CVD base part, at least one other metallic part or both. Further, step b) may further comprise the step of machining a portion of either the MO-CVD deposited material, the predefined geometrical shape material, or both.

According to another embodiment of the invention, a method of fabricating a part. The method comprising: growing at least one material from a vapor phase, by a chemical vapor deposition process (CVD), on a base substrate, wherein the at least one material conforms to one of at least one topographical pattern of the base substrate, one or more predefined geometrical shape on the base substrate or both; wherein the at least one material is a conductive material, non-conductive material or some combination thereof; and removing the base substrate embedded in the CVD deposited material, such that the removed based substrate forms a CVD base part.

According to another aspect of the invention, the method may further comprise the step of securing the CVD base part to one of a second similar CVD base part, at least one another mechanical part or both. The method of securing can be from the group consisting of bonding, brazing, solid-state (diffusion) bonding, E-beam or laser welding, conventional welding. Further, the securing of the CVD base part may be to one of a second similar CVD base part, at least one another metallic part or both, forms one or more features. Wherein the one or more features is from the group consisting of a plurality of final encapsulated channels, at least one channel, at least one optical element, one or more optical devices, at least one optical and electrical feedthrough, one or more wire shaped device or some combination thereof. Further, step b) may further comprise the step of machining a portion of either the MO-CVD deposited material, the predefined geometrical shape material, or both.

According to another aspect of the invention, step a) the CVD process may include using at least one material from the group consisting one of a group of transition elements, a group of platinum elements and a Beryllium material. Wherein the group of transition elements may include at least one material from the group consisting one of Cobalt, Iron, Manganese, Tungsten, Molybdenum, Chromium or some combination thereof. The group of platinum elements may include at least one material from the group consisting one of Platinum, Palladium, Osmium, Iridium, Ruthenium, Rhenium, Rhodium or some combination thereof.

According to another aspect of the invention, the at least one metal material can be two or more materials. Further, the at least one metal material grown on the base substrate can be one of the same metal material grown for the second similar CVD base part and/or the at least one another mechanical part, a different metal material grown for the second similar CVD base part and/or the at least one another mechanical part, or some combination thereof. Further still, the base substrate can be patterned with photoresist, wherein the photoresist is stripped by one of pyrolysis, plasma or chemical etching. Also, the at least one topographical pattern of the base substrate can be from the group consisting of an optical element, an optical device, a portion of a channel, an enclosed channel, an optical feedthrough, an electrical feedthrough, a sensor device, a wire shaped device or some combination thereof. Wherein the optical element can include one of one or more optical window, at least one optical lens or one or more optical filter. The optical device can include one of one or more optical fiber, at least one optical fiber feedthrough or an optical fiber sensor having optical fibers with an intrinsic optical sensor.

According to another aspect of the invention, the one or more predefined geometry shape positioned on the base substrate and second substrate can be from the group consisting of an optical element, an optical device, a portion of a channel, an enclosed channel, an optical feedthrough, an electrical feedthrough, a sensor device, a wire shaped device or some combination thereof. Wherein the optical element can include one of one or more optical window, optical lens or one or more optical filter, along with the optical device may include one of one or more optical fiber, optical fiber feedthrough or an optical fiber sensor having optical fibers with an intrinsic optical sensor. It is also possible, the method can provide for batch manufacturing a plurality of devices such as microfluidic devices having one of an optical element, an optical device, a portion of a channel, an enclosed channel, an optical feedthrough, an electrical feedthrough, a sensor device, a wire shaped device or some combination thereof. Further, step a) the CVD process may include using a Nickel material that provides for conformity onto one or more surface heated to an approximate temperature between 175 to 250 C in a deposition chamber. Wherein the Nickel material deposited onto the one or more surfaces can grow in a conformal manner around one or more exposed component so as to create a pressure seal. The pressure seal can be maintained up to a temperature approximately below a Nickel deposition temperature. Also, the part may be operable in one of a subterranean environment, a well bore, or an oil field application, or the like. Further, the CVD process can be a CVD variant process such as an metalorganic CVD or MO-CVD process.

According to another aspect of the invention, step a) can further comprise of at least one additional geometrical shape in contact with the substrate having an open-pore structure. Wherein the at least one additional geometrical shape in contact with the substrate having the open-pore structure is embedded in the CVD-deposited material wherein the at least one material conforms to one of at least one topographical pattern of the base substrate, one or more predefined geometrical shapes on the base substrate or both. Further, the at least one additional geometric shape can be uniform, non-uniform or any combination thereof. Further still, the at least one additional geometric shape is two or more additional geometric shapes that are structured and arranged by one of uniformly, non-uniformly, equally spaced from one another, non-equally spaced from one another, or any combination thereof. The open-pore structure material can be from the group consisting of one of a conductive material, non-conductive material, a glass, a different material from the at least one material, a metal, a ceramic material, a polymeric material, an insulating material, a non-insulating material or any combination thereof.

According to another embodiment of the invention, a system for fabricating a microfluidic device, comprising the steps of: a) growing at least one material from a vapor phase, by a chemical vapor deposition process (CVD), in particular MO-CVD process, on a heated substrate, wherein the at least one material conforms to one of at least one topographical pattern of the base substrate, one or more predefined geometrical shape on the base substrate or both; and removing the base substrate embedded in the CVD-deposited material.

According to another aspect of the invention, the at least one material can be a conductive material, non-conductive material or some combination thereof. Further, the system may provide for batch manufacturing a plurality of microfluidic devices having one of at least one embedded optical element, an embedded optical device, a portion of a channel, an enclosed channel, an embedded optical feedthrough, an embedded electrical feedthrough, an embedded sensor device, an embedded wire shaped device or some combination thereof. Further still, the at least one component on the substrate can be from the group consisting of an optical element, an optical device, a portion of a channel, an enclosed channel, an optical feedthrough, an electrical feedthrough, a sensor device, a wire shaped device or some combination thereof. Also, the microfluidic device can be capable of operating in one of a subterranean environment, a well bore or an oil field application.

According to another embodiment of the invention, a micro-fluidic device may be capable of operating in an oil field application. The micro-fluidic device comprises: at least one grown material from a vapor phase, by a chemical vapor deposition process (CVD), on a heated substrate, wherein the at least one material conforms to one of at least one topographical pattern of the base substrate, one or more predefined geometrical shape on the base substrate or both; wherein the base substrate is removed from being embedded in the CVD-deposited material.

According to another embodiment of the invention, a method of fabricating one of a device or a part, the method comprising: growing at least one material from a vapor phase, by a Chemical Vapor Deposition (CVD) process, on a base substrate, and at least one additional geometrical shape in contact with the substrate having the open-pore structure; wherein the at least one material conforms to the open-pore structure of the at least one additional geometrical shape in contact with the substrate as well as one of at least one topographical pattern of the base substrate, one or more predefined geometrical shape on the base substrate or both; and removing the base substrate embedded in the CVD-deposited material.

According to another aspect of the invention, the at least one additional geometric shape can be uniform, non-uniform or any combination thereof. Further, the at least one additional geometric shape may be two or more additional geometric shapes that are structured and arranged uniformly, non-uniformly, equally spaced from one another, non-equally spaced from one another, or any combination thereof. Also, the open-pore structure material can be from a group consisting of one of a conductive material, non-conductive material, a glass, a different material from the at least one material, a metal, a ceramic material, a polymeric material, a insulating material, a non-insulating material or any combination thereof. The fabricated device can be a microfluidic device, such that the microfluidic device and/or the fabricated part are operable in one of a subterranean environment, a well bore, or an oil field application.

Further features and advantages of the invention will become more readily apparent from the following detailed description when taken in conjunction with the accompanying drawings.

BRIEF DESCRIPTION OF DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE PREFERRED EMBODIMENTS

Figure 1:
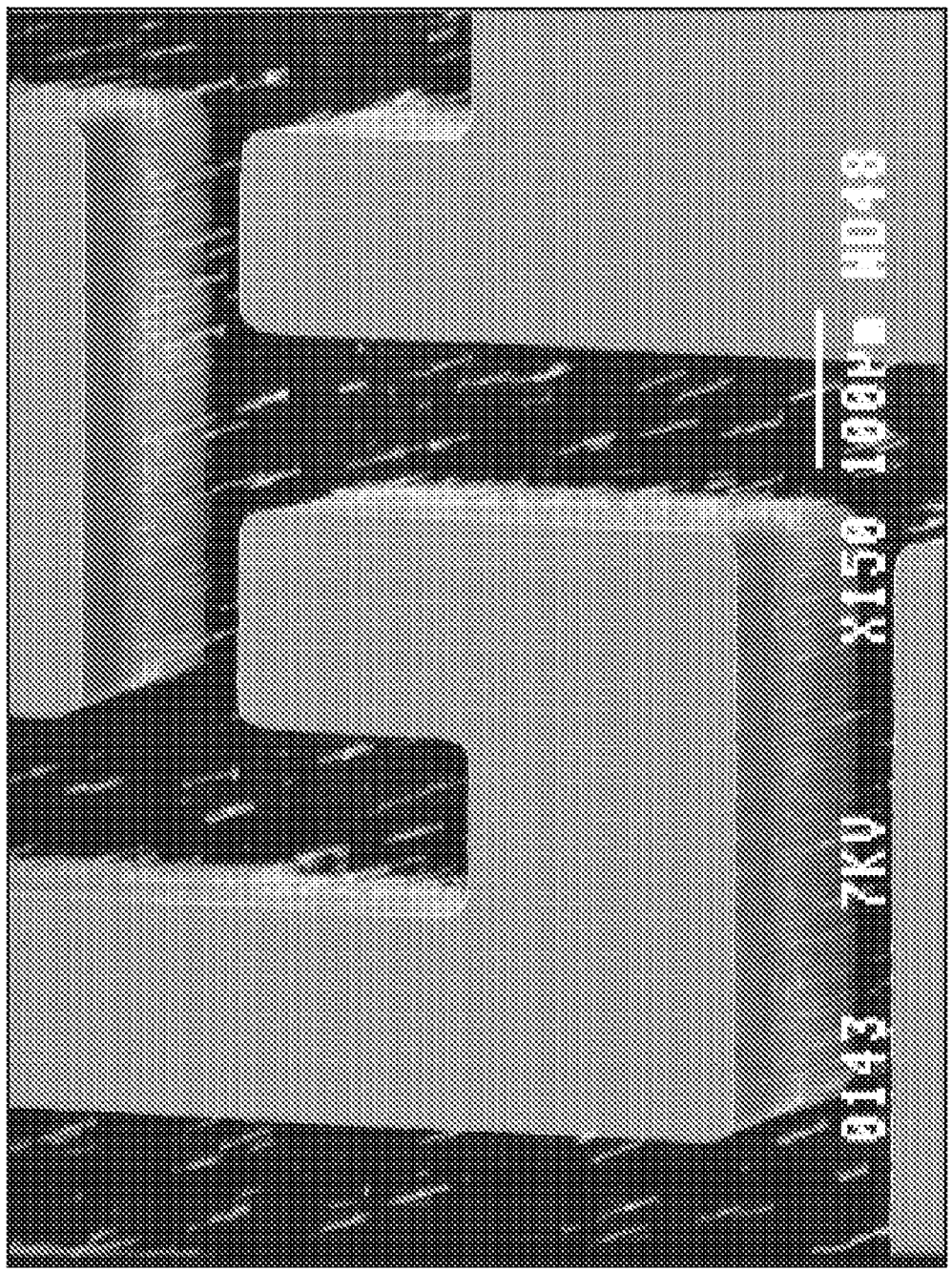
FIG. 1 illustrates an electron micrograph of resulting structures, e.g., DRIE etched Silicon wafer, in accordance with an embodiment of the invention.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice. Further, like reference numbers and designations in the various drawings indicated like elements.

According to embodiments of the invention, the methods and systems may include fabrication techniques allowing for batch manufacturing of micro-structures, such as metallic microfluidic chips with embedded optical elements and/or optical and electrical feedthroughs. It is also possible the devices fabricated from methods and systems of the invention may be used in the oil industry, for example with microfluidic sensors. However, the methods and systems of the invention are not limited to use for a specific industry, by non-limiting example, such other industries contemplated for use may include: pharmaceuticals, biotech, chemical engineering, homeland security, environmental engineering, etc.

Throughout this application, "conformal" will be used to represent the property of "being in close contact with another surface or object, without leaving any voids or spaces". For example, a conformal film on a substrate is a film that is deposited everywhere on the substrate and is in contact at an atomic level with the substrate throughout the surface, regardless of the angles of the surface. A film grown in a conformal manner is a film that perfectly conforms to all the features of the substrate it is deposited on.

According to an embodiment of the invention, a method of fabricating a device, the method includes the step of growing at least one material from a vapor phase, for example by a CVD process, on a heated base substrate, wherein the at least one material conforms to one of at least one topographical pattern of the base substrate, one or more predefined geometry shapes on the base substrate or both. The method includes removing the base substrate embedded in the CVD deposited material, and optionally machining a portion of the CVD deposited material.

According to an embodiment of the invention, a method of fabricating one of a device or a part. The method comprising: growing at least one material from a vapor phase, by a Chemical Vapor Deposition (CVD) process, on a base substrate, wherein the at least one material conforms to one of at least one topographical pattern of the base substrate, one or more predefined geometrical shape on the base substrate or both; and removing the base substrate embedded in the CVD-deposited material.

According to an aspect of the invention, the step of growing the at least one material from a vapor phase, using the CVD process, may be replaced using some other CVD variant process such as an metalorganic CVD or MO-CVD process in accordance with at least one other embodiment of the invention. Further, the at least one material used in the CVD and/or MO-CVD process may include two or more materials. The at least one material maybe a metal, such as a Nickel material that is used in the CVD and/or MO-CVD process.

According to an aspect of the invention, it is noted the base substrate may include one of a Silicon wafer, metal plate, glass plate, or the like, or any combination thereof. Further, the pattern of the topography of the base substrate may or may not be at the microscale which incorporates one or more sacrificial layers, e.g., photoresist layer, etching or both.

According to an aspect of the invention, it is noted the at least one topographical pattern of the base substrate and/or the one or more predefined geometrical shape positioned on the base substrate may be from the group consisting of an optical element (e.g., optical window, optical lenses or optical filters), optical devices (e.g., optical fibers, optical fiber feedthroughs), channels, optical and electrical feedthroughs, sensor device or a wire shaped device or some combination thereof.

It is noted the removal process may include by non-limiting example, one of using dry reactive ion etching, plasma etching, wet chemical etching, ashing, pyrolysis or any combination thereof. Further, it is contemplated that other conventional removal processes known by one skilled in the art may be used. It is also possible the photoresist may be stripped by one of pyrolysis, plasma or chemical etching. The machining process for the portion of the at least one material having conductive properties may include using conventional methods like milling, turning, electrical discharge machining etc. Further, the CVD and/or MO-CVD device and/or part may be machined on one or all sides, for example, only the sides and back of the CVD and/or MO-CVD device and/or part maybe machined.

Overview of Chemical Vapor Deposition

Chemical vapor deposition (CVD) is a method commonly used for depositing various materials onto custom substrates. Vapor metal refining/deposition processes (e.g. the "carbonyl process" for refining base metals, such as Nickel) can be applied to many metals in the transition group (Nickel, Cobalt, Iron, Manganese, Tungsten, Molybdenum, Chromium, etc.) as well as Beryllium and metals in the Platinum group (Platinum, Palladium, Osmium, Iridium, Ruthenium, Rhenium and Rhodium). The CVD process delivers very pure metal at significantly lower operating cost than traditional processes. Its capability of depositing metal layers that atomically conform to a substrate is similar to what can be achieved by electroplating, however the speed of deposition can be greatly improved by comparison (thicknesses of up to 1 cm can be obtained in 24 hours of deposition), and there is no requirement for an electrically conductive substrate. The process is scalable; many parts can be manufactured by CVD in parallel in large deposition chambers, making this method very interesting for batch production of parts.

A material that can be deposited by this method, by non limiting example, is a Nickel metal, which has outstanding strength, chemical and temperature resistance, making it a suitable material for many industries, such as the oil industry. The CVD process for Nickel allows it to deposit in a conformal manner onto any surface heated to a temperature of app. 175-250 C in the deposition chamber. This eliminates the requirement of an electrically conductive substrate and thus opens the door to a variety of fabrication schemes.

Figure 2:
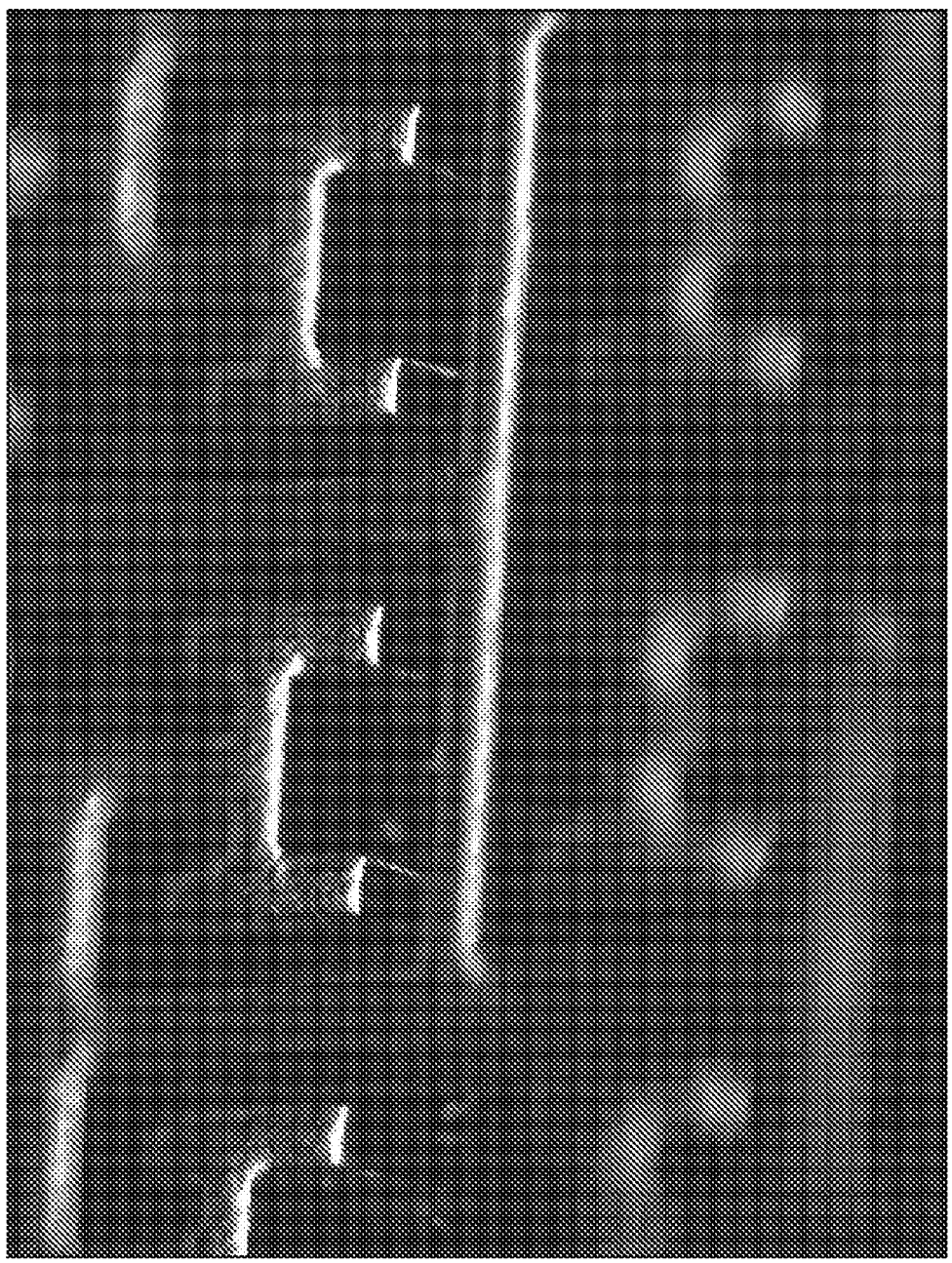
FIG. 2 illustrates a resulting Nickel structure, consisting of a perfect negative copy of the original Silicon topography, in accordance with an embodiment of the invention.

Referring to FIGS. 1 and 2, to test the suitability of this method for fabricating microfluidic devices and microstructures in general, we manufactured a test silicon wafer by standard microfabrication techniques. The wafer had a dense set of features 100 microns wide, which was etched 200 microns deep by a DRIE (deep reactive ion etching) process. FIG. 1 shows an electron micrograph of the resulting structures. The wafer had a 2-mm thick Nickel deposition material grown on the Silicon test wafer. The grown Nickel layer was then separated from the silicon wafer and was placed for several hours in an anisotropic Si etch bath (KOH 30% by weight, 80 C), to remove all the Silicon chips still entrenched in the Nickel structure. FIG. 2 displays the resulting Nickel structure, consisting of a perfect negative copy of the original Silicon topography.

Figure 3:
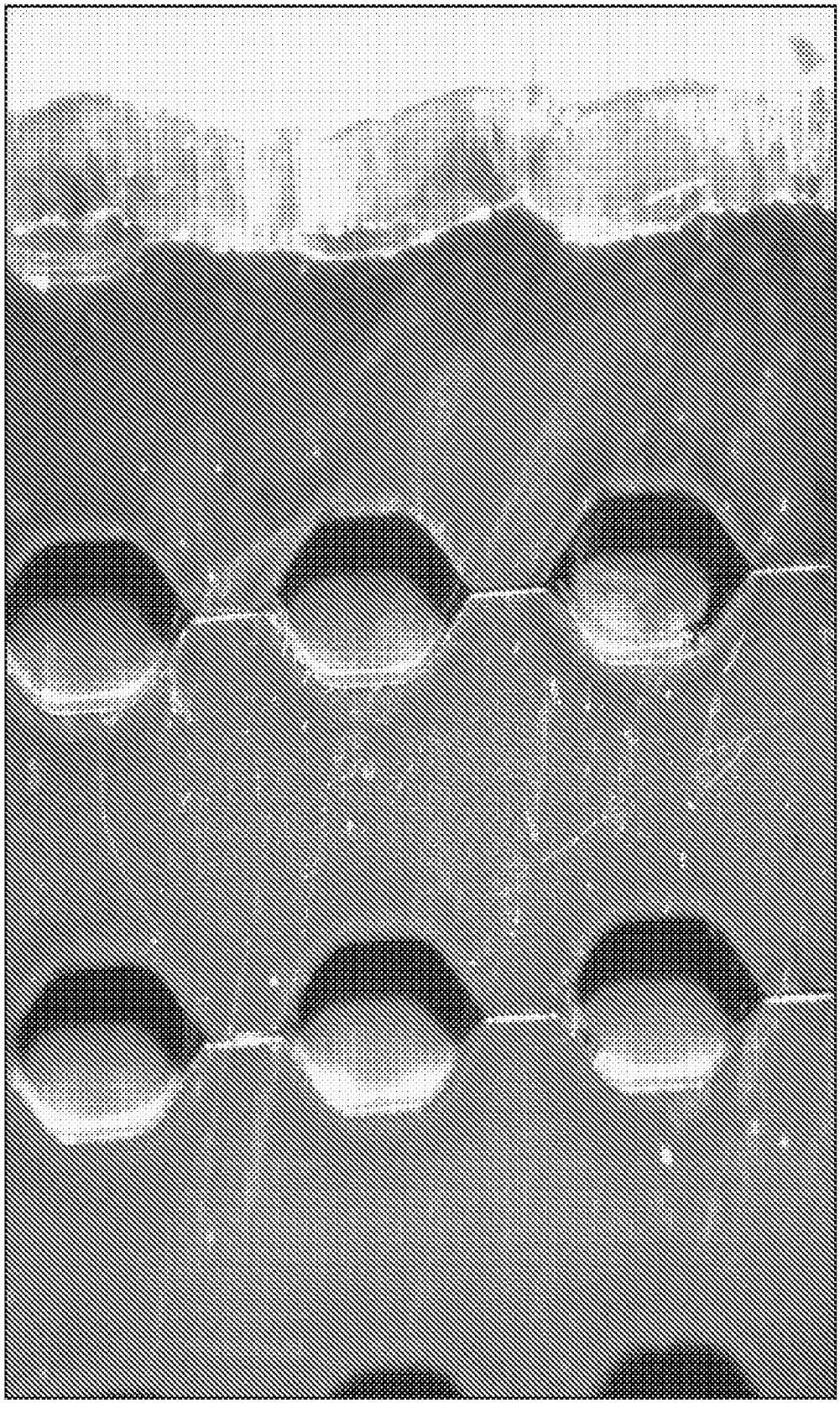
FIG. 3 illustrates a type of structure that can be built using SU8 as a photoresist followed by pyrolysis, in accordance with an embodiment of the invention.

Referring to FIG. 3, similar results can be obtained by using a Si wafer photoresist-patterned by standard lithographic methods. In this case the structure is realized in a photoresist and the Nickel is then grown in a similar way to the one described above. The regions patterned by the resist will result in identical depressions in the Nickel (Several high aspect-ratio photoresists exist which are capable of creating thick layers. Outstanding results have been achieved with SU8-50 and Diaplate. The photoresist entrenched in the Nickel structure can be removed by one of several methods—either chemically, using a stripping agent (this is difficult due to the highly-crosslinked nature of most relevant photoresists) or thermally, by means of pyrolysis. Decent results were obtained by thermal decomposition of the photoresist polymer in a pyrolysis oven filled with a Nitrogen-Hydrogen gas mixture at 900 C for several hours. Some deposits were observed after the pyrolysis of SU8 (which is an epoxy-like material containing some heavy metals in its formulation), the Diaplate (based on acrylic chemistry) offering a much cleaner alternative. FIG. 3 shows the type of structure that was built using SU8 as a photoresist followed by pyrolysis.

Figure 4:
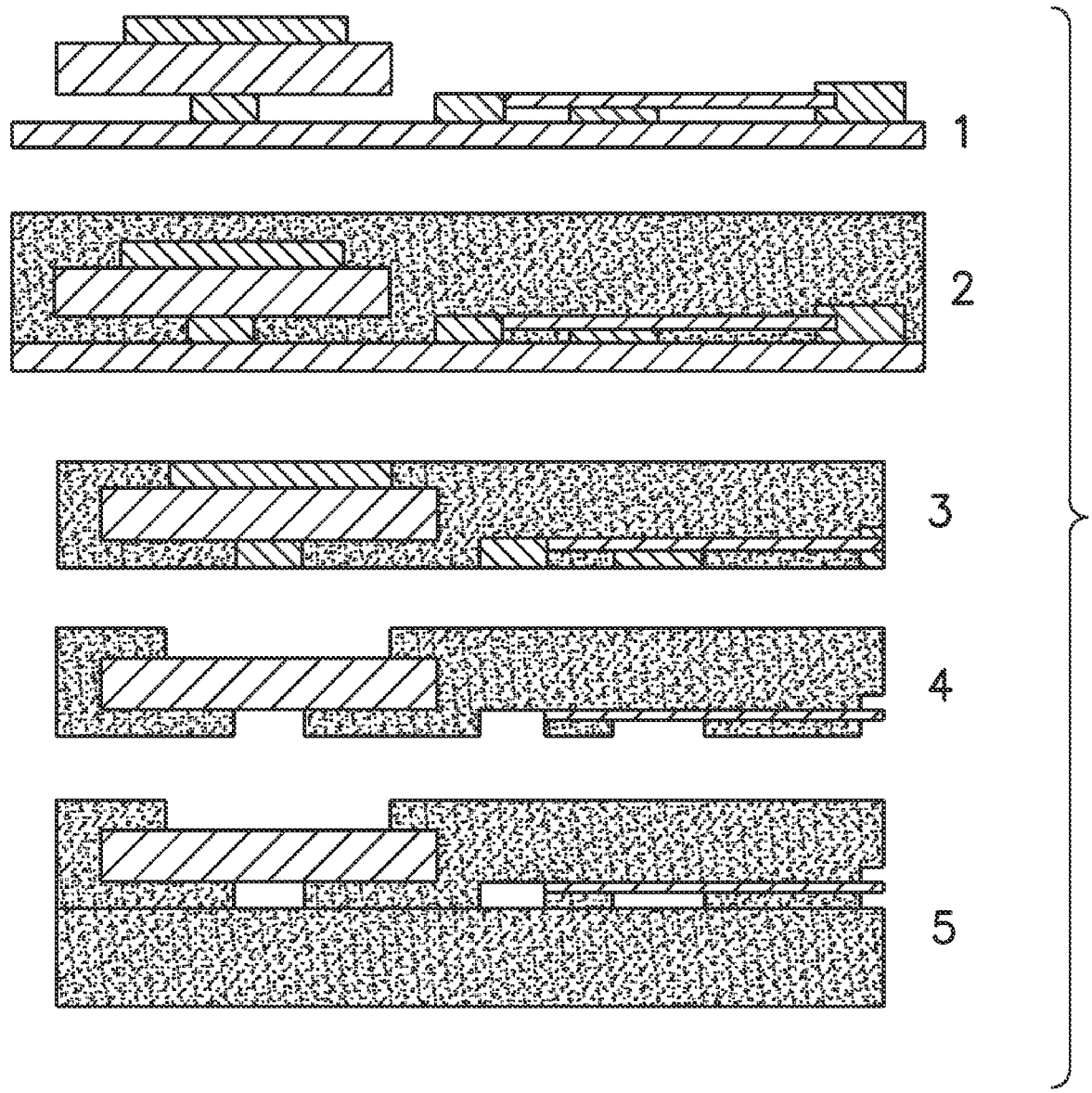
FIG. 4 illustrates a process for integrating optical components, in accordance with an embodiment of the invention.

Referring to FIG. 4, securing of such Nickel parts, and of other metallic external components (such as inlet and outlet tubes) to the Nickel parts, can be achieved by bonding, diffusion bonding (or solid-state welding), welding or brazing. Optical fibers can be secured within the microfluidic channels (by e.g. adhesive bonding, or by metallization followed by brazing) to provide a way to perform optical measurements; alternatively, optical parts may be incorporated during the Nickel deposition process, as described below. The process in that case involves creating a patterned substrate (by non-limiting example, using addition and patterning a photoresist layer, or by etching a pattern into the substrate material), placing several optical parts in conformal contact with the wafer, and performing the Nickel deposition. Since the Nickel is deposited onto any heated surface, it also grows in a conformal manner around any exposed optical parts, implicitly creating an excellent pressure seal. The details of this process for integrating optical components are explained in FIG. 4. Needless to say, electrical connections to the microfluidic chip can be implemented the same way, provided the electrical wires bear proper electrical insulation from the deposited metal. Atomically-grown pinhole-free insulating layers (such as e.g. alumina, up to a few hundred nm thick) can be deposited in a conformal manner on electrical wires by several methods, such as atomic layer deposition (ALD) (See e.g. M. D. Groner et al.: "Electrical characterization of thin Al2O3 films grown by atomic layer deposition on silicon and various metal substrates" Thin Solid Films 412, p. 186 (2002)) and chemical vapor deposition (CVD), making this technology also attractive for electrical feedthrough fabrication.

According to embodiments of the invention, devices and/or parts manufactured by the methods taught in the present invention may be joined and sealed, by non-limiting example, by metallic bonding (such as welding, brazing, diffusion bonding), by adhesive means (using e.g. an epoxy or any type of glue) or by using mechanical fixtures or fastenings (such as bolts and nuts, or clamps) in combination with elastomeric seals (such as o-rings).

One possible issue relating to optical seals may be a difference in the thermal expansion coefficient of the optical elements and of Nickel (or other material as disclosed herewith). Typically, Nickel has a higher expansion coefficient, which means that the seal around any optical parts is improved when temperature is below the Nickel deposition temperature, provided the optical parts can tolerate the stress imposed by the thermal expansion difference. At temperatures higher than the deposition temperature, however, the seal around the optical parts breaks and leaks may develop. It is therefore important to always use such components at temperatures below the deposition temperature. Fortunately Nickel can be deposited by the CVD method at temperatures as high as 250 C, which is high enough for most field applications.

In addition to its use as an integral part of a device, CVD-deposited Nickel can also be used in order to fabricate injection-molding inserts, which can be later used to micromold strong plastics such as PEEK, or ceramic materials. Such mold inserts can have extremely intricate patterns down to extremely small length scales that preclude use of other fabrication technologies.

Figure 5A:
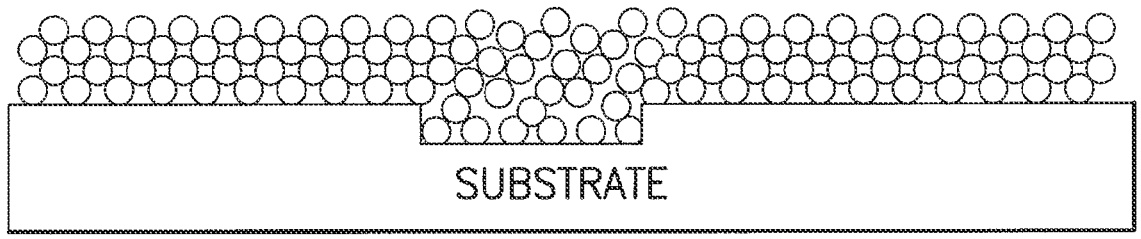
FIGS. 5a, 5b, 5c and 5d show alternative embodiments of the invention, such that a geometrical shape, e.g., or the like, placed on the substrate may include an open-pore structure.
Figure 5B:
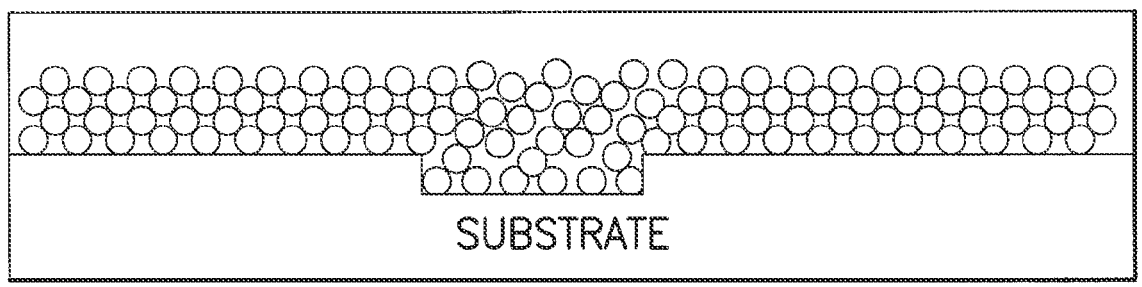
Figure 5C:
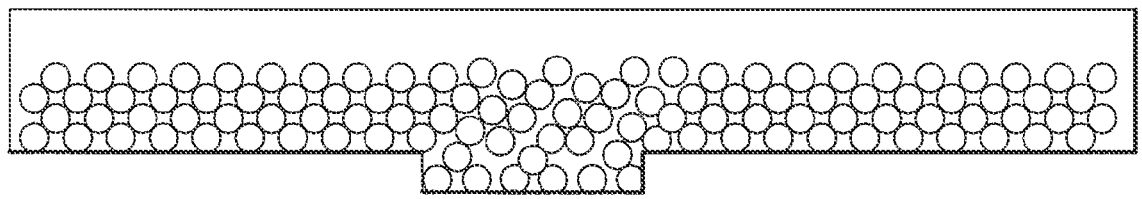
Figure 5D:
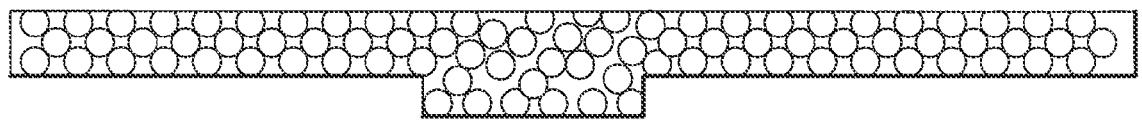
Figure 6A:
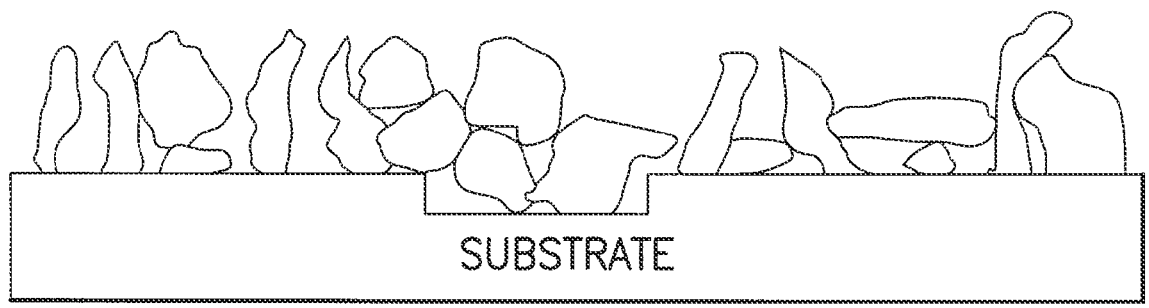
FIGS. 6a, 6b, 6c and 6d show alternative embodiments of the invention, such that a irregular structure, e.g., or the like, placed on the substrate may include an open-pore structure.

FIGS. 5 (5*a*, 5*b*, 5*c* and 5*d*) and 6 (6*a*, 6*b*, 6*c* and 6*d*) show alternative embodiments of the invention, such that a geometrical shape, e.g., or the like, placed on the substrate may include an open-pore structure such as shown in FIGS. 5*a* and 6*a*.

Still referring to FIGS. 5 and 6, it is possible the substrate may, or may not be, topographically patterned. For example, FIGS. 5*b* and 6*b* show a substrate having a channel-like rectangular depression pre-machined (or etched) in it, however a flat substrate may also be used (not shown), as well as any other substrate shape or form. The substrate may also include additional patterned layers, such as photoresist layers (not shown).

For example, the open-pore structure material may be another metal, a ceramic material, a glass, a polymeric material, having conductive or insulating properties, or combination thereof. It is possible an embodiment of the invention may consist of a regular structure as illustrated in FIG. 5*c*, such as an array of beads deposited on the substrate, and/or have a periodic structure in space and/or spacing or not (not shown). It may also consist of an irregular structure as shown in FIGS. 6*a*, 6*b*, 6*c* and 6*d*. It is noted that the structure may consist of a geometric shape that is uniform, non-uniform or any combination thereof.

Also referring to FIGS. 5 and 6, during the CVD or MO-CVD process, the CVD material is deposited in a conformal manner within the openings, or pores, of the geometrical shape structure, filling all the voids as shown in FIG. 5*b*. After the CVD or MO-CVD deposition, the substrate material that may be embedded in the CVD-deposited material is removed by a wet chemical etch, a dry etch, some form of machining, pyrolysis, or a combination thereof as shown in FIG. 5*c*. Finally, both the CVD material and the open-pore geometrical shape material embedded within the CVD material, are formed by a machining process to conform to a desired shape or geometry as shown in FIG. 5*d*.

Figure 6B:
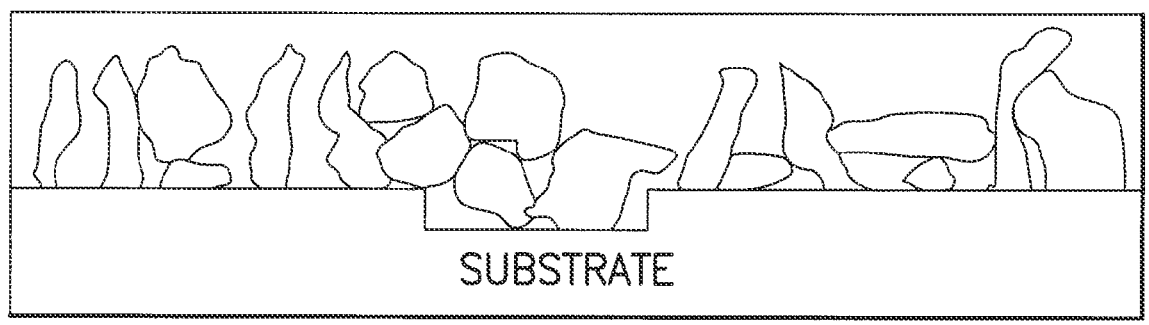
Figure 6C:
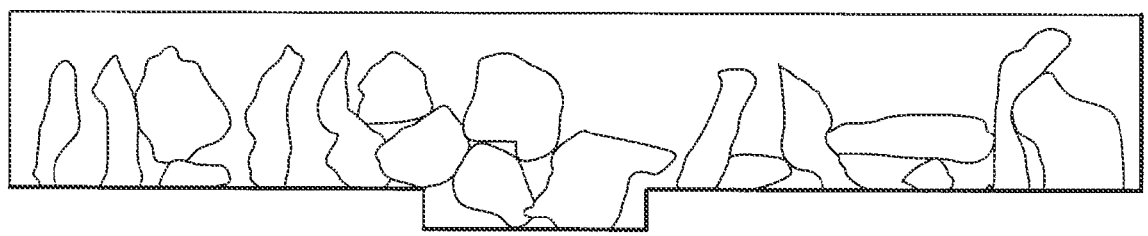
Figure 6D:
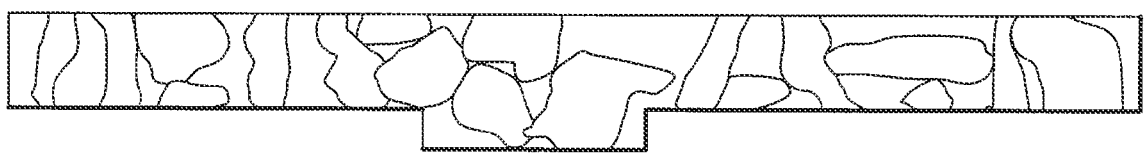

Conversely, the CVD material can be deposited in a conformal manner within the openings, or pores, of the irregular structure, filling all the voids as shown in FIG. 6*b*. After the CVD or MO-CVD deposition, the substrate material that may be embedded in the CVD-deposited material is removed by a wet chemical etch, a dry etch, some form of machining, pyrolysis, or a combination thereof as shown in FIG. 6*c*. Finally, both the CVD material and the open-pore geometrical shape material embedded within the CVD material, are formed by a machining process to conform to a desired shape or geometry as shown in FIG. 6*d*.

The embodiment described above can lead to production of new hybrid materials, having novel electrical, electromagnetic, optical, mechanical or physical properties. In particular, some of the advantages, by non-limiting example, may lead to tougher and stronger materials, and/or to materials having tailored wetting properties, and/or to strong materials that are transparent to electromagnetic radiation.

Figure 7:
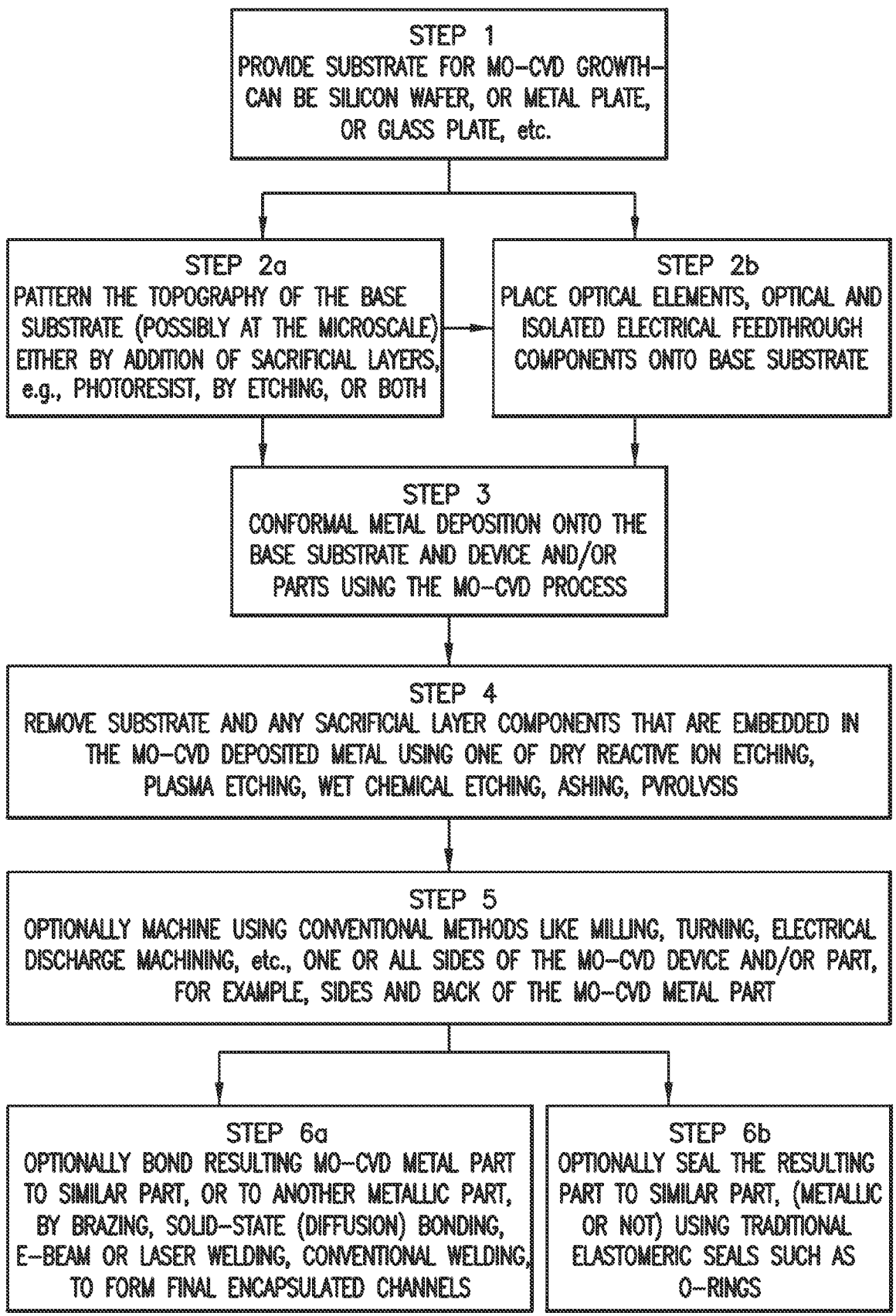
FIG. 7 illustrates a routine that may be used in implementing at least one embodiment of a method of the invention.

FIG. 7 shows at least one embodiment of the invention, a method that may be implemented, for example, for a fabrication CVD variant process such as an metalorganic CVD or MO-CVD process. Step 1 includes growing at least one material from a vapor phase, for example using a MO-CVD process, on a heated base substrate. Step 2*a* and 2*b* may be completed individually or together, such that step 2*a* includes conforming the at least one material to at least one topographical pattern of the base substrate, and 2*b* includes placing one or more predefined geometrical shape on the base substrate. Step 3 includes removing the base substrate embedded in the MO-CVD deposited at least one material, and optionally machining a portion of the at least one material deposited from the vapor phase.

Figure 8:
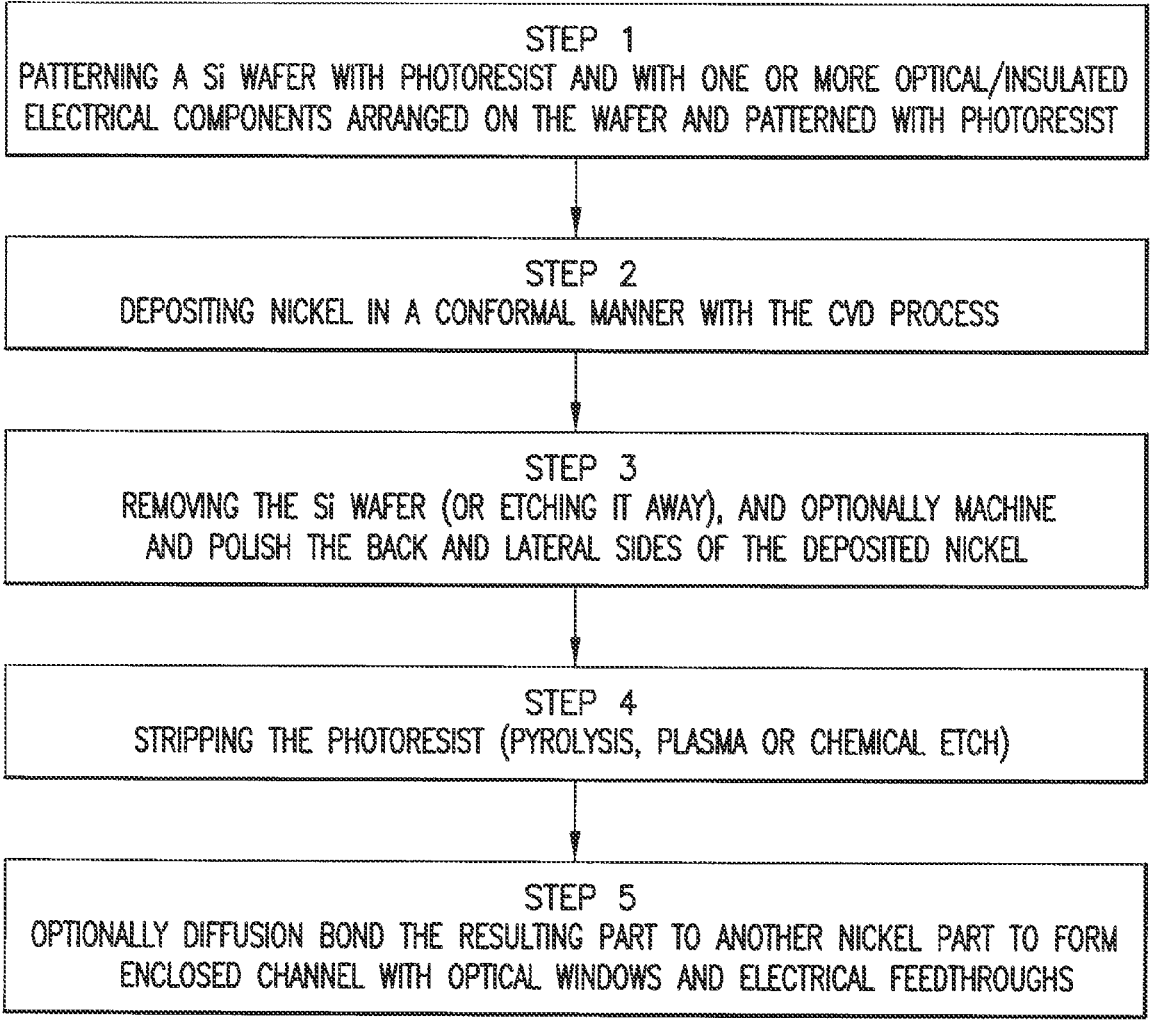
FIG. 8 illustrates another routine that may be used in implementing at least one embodiment of a method of the invention.

FIG. 8 shows at least one embodiment of the invention, a method that may be implemented, for example, for a fabrication MO-CVD Nickel process that integrates optical components (Si wafer: dark grey; Photoresist: green; Optical components (window and fiber): light blue; Nickel: light grey). Step 1 includes a Si wafer patterned with photoresist and optical/insulated electrical components that can be arranged on the wafer and patterned with photoresist. Step 2 includes depositing Nickel conformal with the MO-CVD process. Step 3 provides for removing or etching away the Si wafer, and optionally the back and lateral sides of the deposited Nickel can be machined and polished. Step 4 includes stripping (pyrolysis, plasma or chemical etch) the photoresist. Step 5 provides for diffusion bonding the resulting part to another Nickel part to form an enclosed channel with optical windows/feedthroughs.

Examples of Other Embodiments of Methods and Systems of the Invention

According to another embodiment of the invention, the method includes fabricating a device, including the step of growing at least one material from a vapor phase, by a chemical vapor deposition process (CVD), in particular a MO-CVD process, on a base substrate, wherein the at least one material conforms to one of at least one topographical pattern of the base substrate, one or more predefined geometrical shape on the base substrate or both. Removing the base substrate embedded in the MO-CVD deposited material, such that the removed based substrate forms a MO-CVD base part, and optionally machining a portion of the MO-CVD deposited metal material from the MO-CVD base part. It is also possible to include a step of securing the MO-CVD base part to one of a second similar MO-CVD base part, at least one another metallic part or both. The method of securing is from the group consisting of bonding, brazing, solid-state (diffusion) bonding, E-beam or laser welding, conventional welding, adhesive bonding. Further, the securing of the MO-CVD base part to one of a second similar MO-CVD base part, at least one another metallic part or both, can form one or more features. Wherein the one or more features can be from the group consisting of a plurality of final encapsulated channels, at least one channel, at least one optical element, one or more optical devices, at least one optical and electrical feedthrough, one or more wire shaped device or some combination thereof.

Embodiments of the invention provide for methods and systems for metal microfabrication technology that are capable of allowing for easy integration of optical elements (e.g., optical window, optical lenses or optical filters), channels, optical devices (e.g., optical fibers, optical fiber feedthroughs), optical and electrical feedthroughs, sensor devices or wire shaped devices or some combination thereof in a microfluidic design, among other things.

Whereas many alterations and modifications of the present invention will no doubt become apparent to a person of ordinary skill in the art after having read the foregoing description, it is to be understood that the particular embodiments shown and described by way of illustration are in no way intended to be considered limiting. For example, methods of the invention allow for fabrication of metallic parts with features at the microscale and which are not used in a microfluidic device. Such microstructured parts may become an integral part of oilfield related devices and or applications, such as logging tools, equipment used at the surface or in the lab, permanent downhole installations. Alternatively, the methods taught herein allow fabrication of hybrid materials, such as metallic parts having altered mechanical, thermal, chemical, electrical or electromagnetic properties due to components that are embedded in the structure of the material during the MO-CVD fabrication process. Further, the invention has been described with reference to particular preferred embodiments, but variations within the spirit and scope of the invention will occur to those skilled in the art. It is noted that the foregoing examples have been provided merely for the purpose of explanation and are in no way to be construed as limiting of the present invention. While the present invention has been described with reference to an exemplary embodiment, it is understood that the words, which have been used herein, are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. A method of fabricating a metallic fluidic device, the method comprising:
    disposing at least one component on a base substrate;
    depositing at least one metallic material from a vapor phase onto the base substrate to form a negative metallic part with at least one partially defined fluidic channel and to embed the at least one component within the negative metallic part, wherein the base substrate includes a topographical pattern that forms the at least one partially defined fluidic channel;
    removing the base substrate from the negative metallic part, wherein the at least one component remains within the negative metallic part; and
    securing a second part onto the negative metallic part to enclose the at least one partially defined fluidic channel.

2. The method of claim 1, wherein the topographical pattern of the base substrate is patterned with photoresist.

3. The method of claim 2, wherein the photoresist is stripped by one of pyrolysis, plasma, or chemical etching after the deposition process.

4. The method of claim 1, wherein the process of removing comprises machining a portion of the negative metallic part.

5. The method of claim 1, wherein the method is applied as a batch manufacturing process to manufacture a plurality of metallic fluidic devices.

6. The method of claim 1, wherein the at least one metallic material is at least one of beryllium, a platinum element, or a transition element.

7. The method of claim 6, wherein the transition element is at least one of cobalt, iron, manganese, tungsten, molybdenum, or chromium.

8. The method of claim 6, wherein the platinum element is at least one of platinum, palladium, osmium, iridium, ruthenium, rhenium, or rhodium.

9. The method of claim 1, further comprising:
    disposing a porous material onto the base substrate.

10. The method of claim 9, further comprising:
    depositing the at least one metallic material onto the porous material.

11. The method of claim 9, wherein the porous material is uniform, non-uniform or any combination thereof.

12. The method of claim 9, wherein the porous material is at least one of a conductive material, a non-conductive material, a glass, a different material from the at least one metallic material, a metal, a ceramic material, a polymeric material, an insulating material, or a non-insulating material.

13. The method of claim 1, wherein the metallic fluidic device, is operable in at least one of a subterranean environment, a well bore, or an oil field application.

14. The method of claim 1, wherein the securing process includes at least one of bonding, brazing, solid-state (diffusion) bonding, E-beam or laser welding, or conventional welding.

15. The method of claim 1, wherein the second part is metallic.

16. The method of claim 15, wherein the second part is a negative metallic part.

17. The method of claim 1, wherein the at least one metallic material is nickel.

18. The method of claim 1, wherein the at least one metallic material is nickel and the nickel is deposited using a chemical vapor deposition (CVD) process.

19. The method of claim 18, wherein the CVD process is a metalorganic CVD (MO-CVD) process.

20. The method of claim 1, wherein the at least one component is at least one of an optical element, an optical device, an optical feedthrough, an electrical feedthrough, a sensor device, or a wire shaped device.

21. The method of claim 20, wherein the optical element is at least one of an optical window, an optical lens, or an optical filter.

22. The method of claim 20, wherein the optical device is at least one of an optical fiber, an optical fiber feedthrough, or an optical fiber sensor having optical fibers with an intrinsic optical sensor.

23. The method of claim 18, wherein the at least one component is at least one of an optical element, a ceramic device, an isolated electrical device, a sensor device, or a wire shaped device.

24. The method of claim 23, wherein the optical element is at least one of an optical window, an optical lens, or an optical filter.

25. The method of claim 18, wherein the nickel is deposited within a CVD deposition chamber and at least a portion of the base substrate is heated to an approximate temperature between 175° C. to 250° C.

26. The method of claim 18, wherein the nickel is conformally deposited around the at least one component so as to create a pressure seal between the at least one component and the negative metallic part.

27. The method of claim 26, wherein the pressure seal is maintained below a temperature of 250° C.

28. The method of claim 1, wherein the fluidic device is a microfluidic device.

* * * * *